United States Patent
Chang et al.

(10) Patent No.: US 11,137,581 B2
(45) Date of Patent: Oct. 5, 2021

(54) WAFER-LEVEL HOMOGENEOUS BONDING OPTICAL STRUCTURE AND METHOD TO FORM THE SAME

(71) Applicant: HIMAX TECHNOLOGIES LIMITED, Tainan (TW)

(72) Inventors: Chih-Sheng Chang, Tainan (TW); Teng-Te Huang, Tainan (TW); Shu-Hao Hsu, Tainan (TW); Jun-Yu Zhan, Tainan (TW); Jen-Hui Lai, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 181 days.

(21) Appl. No.: 16/145,105

(22) Filed: Sep. 27, 2018

(65) Prior Publication Data

US 2020/0103633 A1 Apr. 2, 2020

(51) Int. Cl.
*G02B 13/00* (2006.01)
*H01L 27/146* (2006.01)
*C03B 23/22* (2006.01)

(52) U.S. Cl.
CPC .......... *G02B 13/0085* (2013.01); *C03B 23/22* (2013.01); *H01L 27/14627* (2013.01); *H01L 27/14685* (2013.01); *H01L 27/14687* (2013.01)

(58) Field of Classification Search
CPC ..... C03B 23/22; C03B 23/20; G02B 13/0085; H01L 27/14627; H01L 27/14685; H01L 27/14687
See application file for complete search history.

(56) References Cited

U.S. PATENT DOCUMENTS

| 6,324,010 | B1 * | 11/2001 | Bowen ............. B29D 11/00403 359/622 |
|---|---|---|---|
| 2002/0090180 | A1 | 7/2002 | Silverbrook |
| 2010/0123260 | A1 * | 5/2010 | Duparre ............ H01L 27/14687 264/1.38 |
| 2010/0128350 | A1 * | 5/2010 | Findlay ............. H01L 27/14629 359/601 |
| 2012/0319001 | A1 * | 12/2012 | Tsunoda .................. H01J 37/12 250/396 R |
| 2013/0048208 | A1 * | 2/2013 | Lin .................... H01L 27/14683 156/247 |
| 2015/0273624 | A1 * | 10/2015 | Yoshida ................. C03C 27/00 428/209 |
| 2017/0323920 | A1 | 11/2017 | Kumar |
| 2018/0226530 | A1 | 8/2018 | Rudmann |

FOREIGN PATENT DOCUMENTS

| TW | 200849633 | | 12/2008 |
|---|---|---|---|
| TW | 201143044 | A1 | 12/2011 |
| TW | 201320315 | A1 | 5/2013 |
| TW | 201812379 | A | 4/2018 |

* cited by examiner

*Primary Examiner* — Cara E Rakowski
(74) *Attorney, Agent, or Firm* — Winston Hsu

(57) ABSTRACT

A wafer-level homogeneous bonding optical structure includes two optical lens sets disposed on an optically transparent wafer and a spacer disposed on the optically transparent wafer and between the two optical lens sets. The spacer is homogeneously bonded to and integrated with the optically transparent wafer in the absence of a heterogeneous adhesive.

20 Claims, 12 Drawing Sheets

WAFER-LEVEL HOMOGENEOUS BONDING OPTICAL STRUCTURE AND METHOD TO FORM THE SAME

BACKGROUND OF THE INVENTION

1. Field of the Invention

The present invention generally relates to a wafer-level homogeneous bonding optical structure as well as a method to form a wafer-level homogeneous bonding optical structure. In particular, the present invention is directed to a wafer-level homogeneous bonding optical structure which is free of bow distortion or free of interlayer misalignment to overcome problems in prior art. The present invention is also directed to a method to form a wafer-level homogeneous bonding optical structure in the absence of a thermal treatment and of a heterogeneous adhesive to overcome more problems in prior art.

2. Description of the Prior Art

In addition to fabricate optical lens sets which are required to assemble individually from a multitude of individual parts, it is also possible to fabricate a large area of optical lens sets on an optical glass wafer with the help of the conventional semiconductor manufacture process at the same time. This top-tier technology is known as "wafer-level optical lens sets". This kind of optical lens set may be used in a 3D sensor.

The wafer-level fabrication and integration of multiple micro-optical components is a promising alternative which assembles a CMOS image sensor, multiple polymeric lenses molded onto a glass wafer, multiple spacers to segregate the multiple polymeric lenses and a cover layer. When spacers are attached to the lens layer to be fixed on the lens layer, a dry film is needed to help spacers firmly fixed on the lens layer. For this purpose, a thermal treatment is required to make the dry film firmly fix the spacers on the lens layer.

When the wafer undergoes a thermal treatment to process the dry film, it would induce several problems. First, due to the composite combination of distinctive materials (for example, a polymeric layer molded onto a glass wafer) and to thermal expansion difference, the bulk substrate (the polymeric layer on the glass wafer) would suffer bow distortion owing to uneven internal stress. A substrate with bow distortion shows a defect appearance.

Second, due to the bow distortion, the greater the distance is from the wafer center, the worse is the deformation. Because of this regional shift problem, the overall alignment of the spacers with the polymeric lenses is not possible. Even when a part of the spacers well align with the corresponding polymeric lenses, other parts of the spacers are prone to misalign with the corresponding polymeric lenses.

Third, a polymeric layer itself is susceptible to deformation in the presence of a thermal treatment which raises the temperature close to its glass transition temperature (Tg). The deformation of the polymeric layer itself along with the overall bow distortion of the substrate makes the misalignment problem even worse.

Given the above, it is still needed to proposes a novel method to form a wafer-level optical structure in the absence of a thermal treatment to overcome the above problems in prior art.

SUMMARY OF THE INVENTION

In the light of the problems in prior art, the present invention proposes a novel wafer-level homogeneous bonding optical structure as well as a novel method to form a wafer-level homogeneous bonding optical structure in the absence of a thermal treatment to overcome the above problems in prior art. Because the novel method to forma wafer-level homogeneous bonding optical structure of the present invention employs no overall thermal treatment in the manufacturing procedures, the obtained wafer-level homogeneous bonding optical structure suffers no bow distortion to yield better optical performance and interlayer alignment accuracy.

The present invention in a first aspect provides a novel method to form a wafer-level homogeneous bonding optical structure in the absence of a thermal treatment to overcome the above problems in prior art. First, an optically transparent wafer is provided. There are a plurality of optical lens sets disposed on the optically transparent wafer, for example, there are at least two optical lens sets disposed on the optically transparent wafer. In particular, each of the optical lens sets is isolated and not in contact with one another. The optical lens set includes a lens integrated with a residual layer. Second, at least one spacer is provided on the optically transparent wafer. The spacer is in direct contact with the optically transparent wafer so that the spacer is disposed between two adjacent the optical lens sets to segregate the two adjacent optical lens sets. Next, a laser treatment is carried out on the interfaces between the spacers and the optically transparent wafer so that the spacers are homogeneously bonded to the optically transparent wafer in the absence of a heterogeneous adhesive.

In one embodiment of the method to form a wafer-level homogeneous bonding optical structure of the present invention, both the optically transparent wafer and the spacers are made of glass so that the spacers are capable of being integrated with the optically transparent wafer after the laser treatment in the absence of the heterogeneous adhesive.

In another embodiment of the method to form a wafer-level homogeneous bonding optical structure of the present invention, wherein the laser treatment has a maximum power of 100 W with a wavelength not greater than 1060 nm.

In another embodiment of the method to form a wafer-level homogeneous bonding optical structure of the present invention, each one of the optical lens sets includes an extending shoulder to surround the residual layer. The extending shoulder is not in contact with another extending shoulder of an adjacent spacer.

In another embodiment of the method to form a wafer-level homogeneous bonding optical structure of the present invention, the method further includes the following steps. First, an optically transparent substrate is provided. The optically transparent substrate is disposed on the spacers and in direct contact with the spacers. Next, a substrate laser treatment is carried out on the interfaces between the spacers and the optically transparent substrate so that the spacer is homogeneously bonded to the optically transparent substrate in the absence of a heterogeneous adhesive.

In another embodiment of the method to form a wafer-level homogeneous bonding optical structure of the present invention, both the spacers and the optically transparent substrate are made of glass so that the spacers are capable of being homogeneously bonded to the optically transparent substrate after the substrate laser treatment in the absence of the heterogeneous adhesive.

In another embodiment of the method to form a wafer-level homogeneous bonding optical structure of the present invention, wherein the substrate laser treatment has a maximum power of 100 W with a wavelength not greater than 1060 nm.

In another embodiment of the method to form a wafer-level homogeneous bonding optical structure of the present invention, the method further includes forming a plurality of imaging optical lens sets, for example, at least two imaging optical lens sets to be disposed on the optically transparent substrate. The imaging optical lens sets respectively correspond to the optical lens sets.

In another embodiment of the method to form a wafer-level homogeneous bonding optical structure of the present invention, the method further includes forming a plurality of bottom optical lens sets, for example, at least two bottom optical lens sets to be disposed on the optically transparent wafer. The bottom optical lens sets are located beneath the optical lens sets and respectively correspond to the optical lens sets.

The present invention in a second aspect provides another novel method to form a wafer-level homogeneous bonding optical structure in the absence of a thermal treatment to overcome the above problems in prior art. First, an optically transparent wafer is provided. There are a plurality of optical lens sets disposed on the optically transparent wafer, for example, there are at least two optical lens sets disposed on the optically transparent wafer. In particular, each one of the optical lens sets is isolated and not in contact with one another. The optical lens set includes a lens integrated with a residual layer. Second, an optically transparent substrate is provided. There are a plurality of spacers, for example, there are at least one spacer disposed on the optically transparent substrate. Next, the optically transparent substrate is combined with the optically transparent wafer so that the optically transparent wafer is in direct with the spacers and the spacer is disposed between two adjacent optical lens sets to segregate the two adjacent optical lens sets. Then, a laser treatment is carried out on the interfaces between the spacers and the optically transparent wafer so that the spacer is homogeneously bonded to the optically transparent wafer in the absence of a heterogeneous adhesive.

In one embodiment of the method to forma wafer-level homogeneous bonding optical structure of the present invention, both the optically transparent wafer and the spacers are made of glass so that the spacers are capable of being attached to the optically transparent wafer after the laser treatment in the absence of the heterogeneous adhesive.

The present invention in a third aspect proposes a novel wafer-level homogeneous bonding optical structure to be free of bow distortion or free of interlayer misalignment to overcome the problems in prior art. The wafer-level homogeneous bonding optical structure of the present invention includes an optically transparent wafer, a plurality of optical lens sets, and at least one spacer. There are a plurality of optical lens sets disposed on the optically transparent wafer, for example, there are at least two optical lens sets disposed on the optically transparent wafer. In particular, each one of the optical lens sets includes a lens integrated with a residual layer. There is at least one spacer disposed on the optically transparent wafer, for example, there is at least one spacer disposed on the optically transparent wafer. In particular, the spacer is disposed between two adjacent optical lens sets. The spacers are homogeneously bonded to the optically transparent wafer in the absence of a heterogeneous adhesive.

In one embodiment of the wafer-level homogeneous bonding optical structure, the optically transparent wafer is flat glass.

In another embodiment of the wafer-level homogeneous bonding optical structure, the spacers are made of glass so that the spacers are capable of being integrated with the optically transparent wafer in the absence of the heterogeneous adhesive.

In another embodiment of the wafer-level homogeneous bonding optical structure, each of the optical lens sets includes an extending shoulder. The extending shoulder is not in contact with another adjacent spacer.

In another embodiment of the wafer-level homogeneous bonding optical structure, each one of the optical lens sets is isolated so that the spacer segregates two adjacent optical lens sets.

In another embodiment of the wafer-level homogeneous bonding optical structure, the wafer-level homogeneous bonding optical structure further includes an optically transparent substrate. The optically transparent substrate is disposed on the spacers and in direct contact with the spacers.

In another embodiment of the wafer-level homogeneous bonding optical structure, both the spacers and the optically transparent substrate are made of glass so that the spacers are capable of being homogeneously bonded to the optically transparent substrate in the absence of the heterogeneous adhesive.

In another embodiment of the wafer-level homogeneous bonding optical structure, the wafer-level homogeneous bonding optical structure further includes a plurality of imaging optical lens sets. The imaging optical lens sets are disposed on the optically transparent substrate and respectively correspond to the optical lens sets.

In another embodiment of the wafer-level homogeneous bonding optical structure, the wafer-level homogeneous bonding optical structure further includes a plurality of bottom optical lens sets. The bottom optical lens sets are disposed on the optically transparent wafer and located beneath the optical lens sets. The bottom optical lens sets respectively correspond to the optical lens sets.

Because the novel method to form a wafer-level homogeneous bonding optical structure of the present invention does not use a thermal treatment to fix the spacers on the optically transparent wafer, the bow distortion of the optically transparent wafer along with the polymeric layer is substantially eliminated. Further, there is no thermal treatment either to cause undesirable regional misalignment of stack layers to overcome the problems in prior art. Additionally, the polymeric layer itself does not deform anymore to relieve the misalignment problem. Accordingly, the obtained novel wafer-level homogeneous bonding optical structure has neither undesirable bow distortion nor undesirable interlayer misalignment to show better product quality, outstanding appearance and optical performance.

These and other objectives of the present invention will no doubt become obvious to those of ordinary skill in the art after reading the following detailed description of the preferred embodiment that is illustrated in the various figures and drawings.

DETAILED DESCRIPTION

To eliminate undesirable bow distortion or interlayer misalignment, the present invention provides a novel method to form a homogeneous bonding optical structure on a wafer-level scale. The novel method of the present invention proposes an alternative approach to permanently fix the spacers to an optically transparent wafer or to an optically transparent substrate in the absence of a heterogeneous adhesive to avoid undesirable bow distortion of the optically transparent wafer or undesirable interlayer misalignment which is caused by the thermal treatment required by a heterogeneous adhesive. Because of the homogeneous bonding, the spacers in the novel wafer-level homogeneous bonding optical structure of the present invention are integrated with the optically transparent wafer or with the optically transparent substrate to exhibit better product quality, interlayer alignment accuracy and optical performance.

FIG. 1 to FIG. 6 illustrate a first example of a novel method to form a wafer-level homogeneous bonding optical structure of the present invention. Please refer to FIG. 1. First, an optically transparent wafer 110 is provided. The optically transparent wafer 110 may be a glass wafer made of optically transparent material, such as glass or a silica material, for use as a carrier in an optical lens structure. Preferably speaking, the optically transparent material for the optically transparent wafer 110 may be glass with the coefficient of thermal expansion as small as possible. "Optically transparent" refers to a material which allows light of specific wavelength to pass through the material without substantially reducing the intensity of the light.

There are multiple optical lens sets 120 disposed on the optically transparent wafer 110. For example, there are at least two optical lens sets 120 disposed on and in direct contact with the optically transparent wafer 110. Preferably speaking, there are multiple optical lens sets 120 to form an array disposed on the optically transparent wafer 110.

Figure 1:
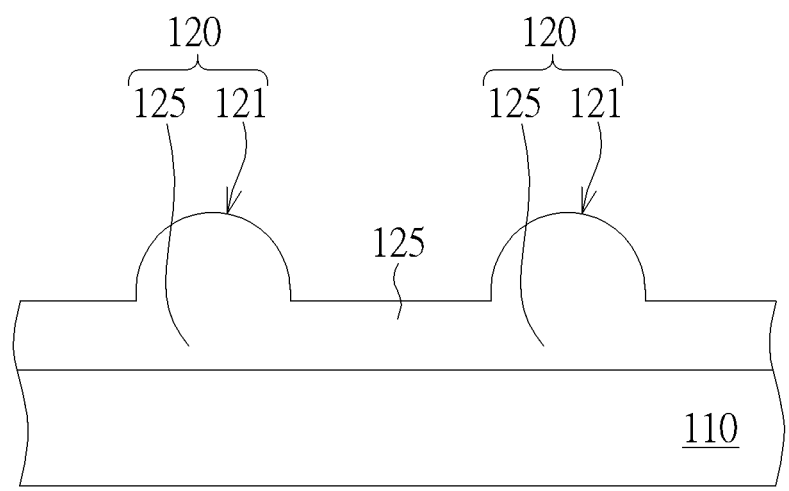
FIG. 1, FIG. 2, FIG. 3, FIG. 4 and FIG. 5 illustrate a first example of a novel method to form a wafer-level homogeneous bonding optical structure of the present invention.

As shown in FIG. 1, the multiple optical lens sets 120 disposed on the optically transparent wafer 110 include multiple lenses 121 integrated with one residual layer 125. Each optical lens set 120 includes one single lens 121 integrated with the residual layer 125. The lenses 121 and the residual layer 125 are made of the same optically transparent material to serve as the optical lens sets 120. For example, the optically transparent material may be a polymeric material. The surface curvature of each lens 121 may be either convex or concave.

Preferably speaking, the polymeric material for the optical lens sets 120 may be an acrylate-type material or a methacrylate-type material. The lenses 121 and the residual layer 125 are integrally formed or one-piece formed so the lenses 121 and the residual layer 125 are integrated with one another and not separable. For example, the lenses 121 and the residual layer 125 may be formed by the polymerization of monomers or oligomers of an acrylate-type material or a methacrylate-type material in the presence of a template (not shown) to facilitate the formation of the surface curvature of each lens 121.

Figure 2:
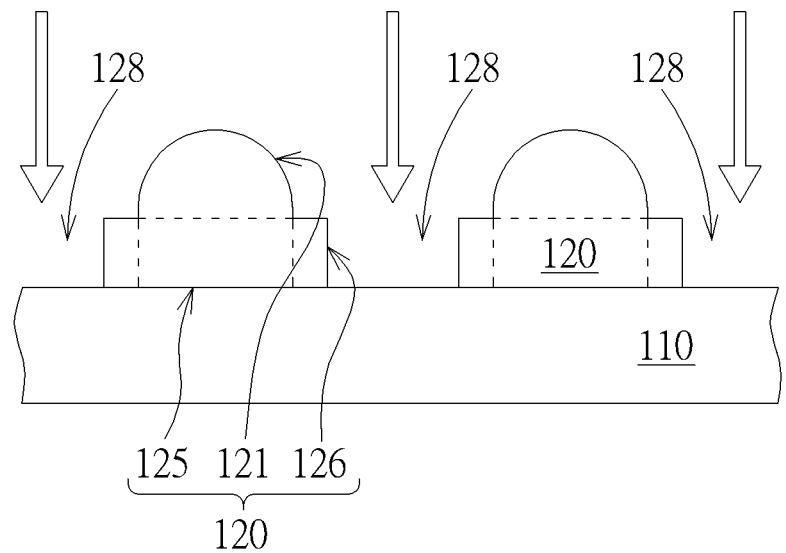

Second, please refer to FIG. 2, a removal step is carried out to remove the residual layer 125 which is directly disposed between two adjacent lenses 121. The removal step is used to divide the mutually connected multiple optical lens sets 120 to simultaneously form multiple individual optical lens sets 120 and multiple scribe lines 128. Each scribe line 128 is sandwiched between two adjacent individual optical lens sets 120. In particular, the residual layer 125 is deeply removed so that the optically transparent wafer 110 underlying the scribe line 128 is exposed.

Laser may be used to carry out the removal step. For example, the removal step may be carried out to remove the residual layer 125 in the presence of laser. Preferably speaking, as shown in FIG. 2, the residual layer 125 is partially removed so that each optical lens set 120 has a shoulder 126 and in FIG. 2A, the residual layer 125 is partially removed so that each optical lens set 120 has no shoulder.

Figure 2A:
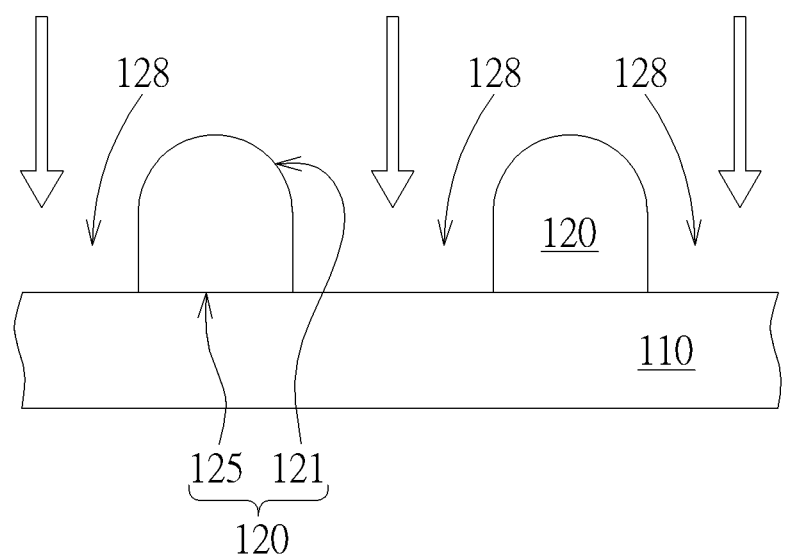
FIG. 2A illustrates that the residual layer is partially removed so that each optical lens set has no shoulder.

For example, the residual layer 125 in each optical lens set 120 is wider than the lens 121 atop and the wider region of the residual layer 125 in each optical lens set 120 serves as the extending shoulder 126 of the optical lens set 120. Or alternatively, as shown in FIG. 2A, the residual layer 125 sandwiched between two adjacent individual optical lens sets 120 is completely removed so that there is no shoulder in each optical lens set 120. A wider shoulder 126 makes the scribe line 128 narrower. After the removal step, each optical lens set 120 is isolated and not in contact with one another. Each optical lens set 120 includes one single lens 121 integrated with the residual layer 120, with or without an extending shoulder 126.

Figure 3:
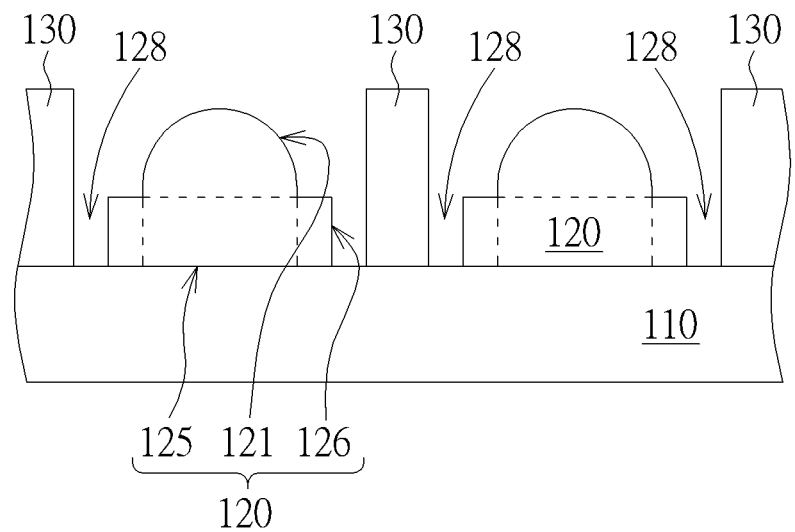

Next, please refer to FIG. 3, at least one spacer 130 are provided on the optically transparent wafer 110. In particular, each spacer 130 is in direct contact with the optically transparent wafer 110 so there is no glue, no dry film or any other adhesive disposed between the spacer 130 and the optically transparent wafer 110. Further, the spacer 130 is partially placed in the scribe line 128. In other words, the spacer 130 is disposed between two adjacent the optical lens sets 120 to segregate two adjacent optical lens sets 120.

Figure 3A:
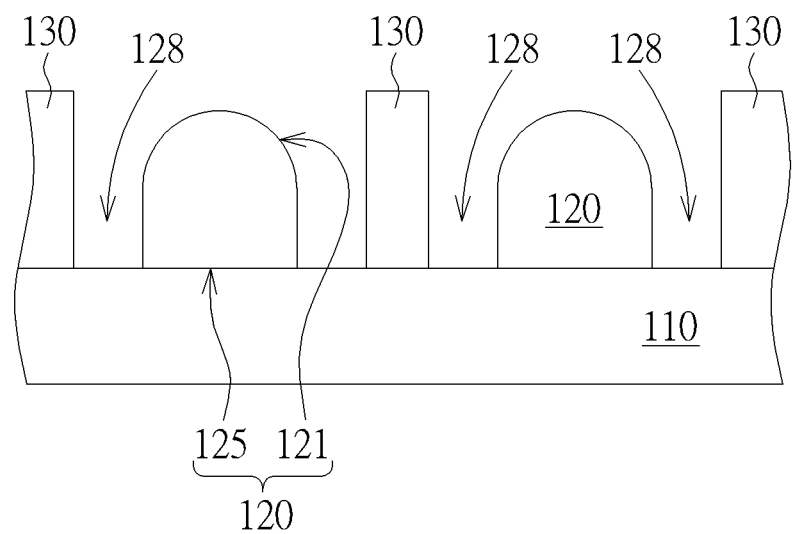
FIG. 3A illustrates that a spacer is provided in a scribe line and between two optical lens sets with no shoulder.

Preferably, with or without a shoulder 126, the spacer 130 is not in direct contact with any one of the optical lens sets 120. FIG. 3 illustrates that a spacer 130 is provided in a scribe line 128 and between two optical lens sets 120 in the presence of two individual shoulders 126 and FIG. 3A illustrates that a spacer 130 is provided in a scribe line 128 and between two optical lens sets 120 with no shoulder.

Figure 3B:
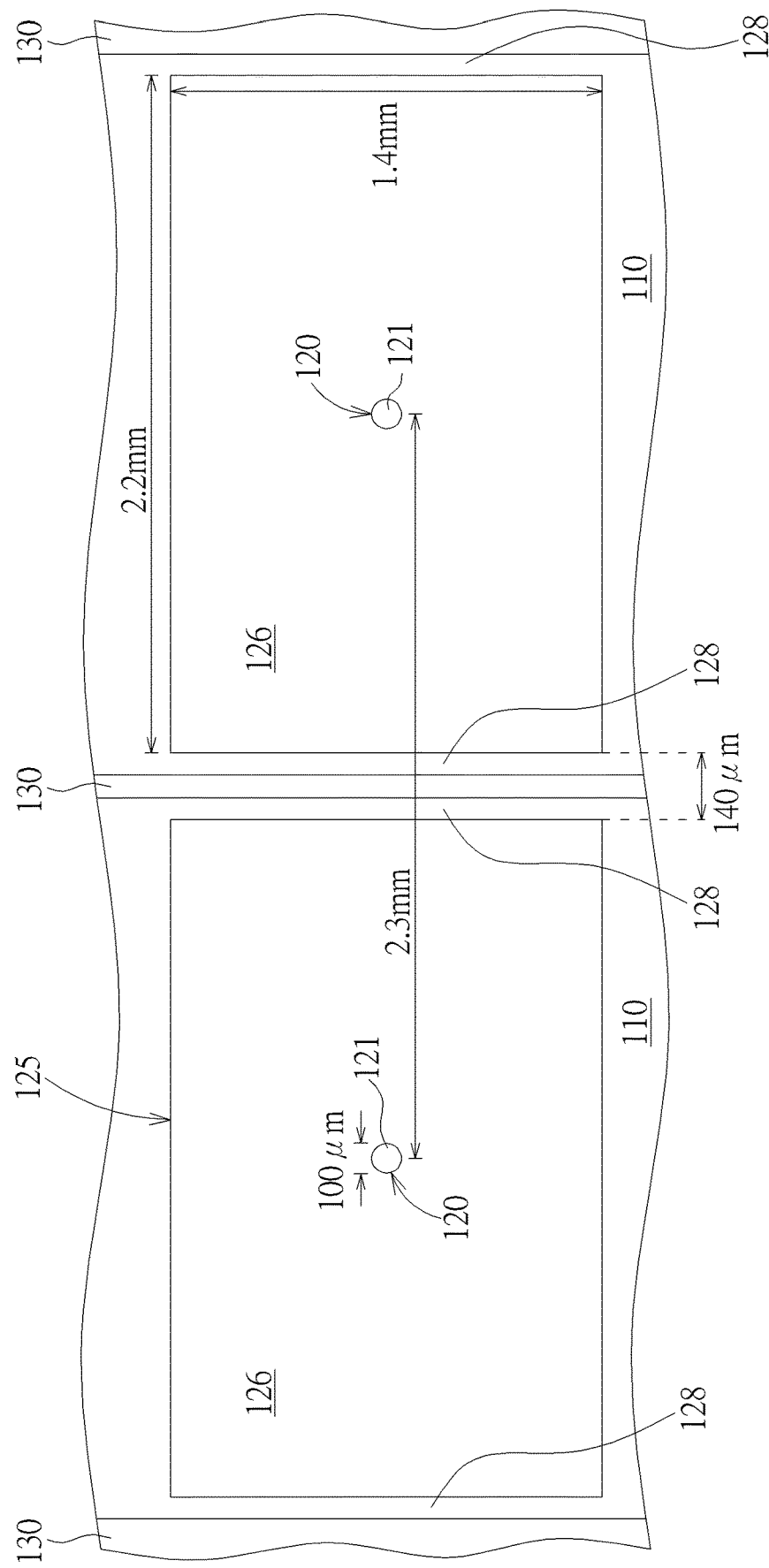
FIG. 3B illustrates a top view of FIG. 3.

FIG. 3B illustrates a top view of FIG. 3. The size of the spacer 130 is dependent upon the sizes of the optical lens set 120 and of the scribe line 128. For example, the diameter of a lens 121 may be approximately 100 μm. The residual layer 125 with shoulders 126 of an optical lens set 120 may be in a shape of a rectangular with the dimensions of approximately 1.4 mm*2.2 mm. The pitch of two adjacent the optical lens sets 120 (from the center of one lens 121 to the center of another adjacent lens 121) is approximately 2.3 mm and the width of the scribe line 128 may be approximately 140 μm. Preferably, the width of a spacer 130 is smaller than that of a scribe line 128. For example, the width of a spacer may be 130 μm. However, the sizes of the above mentioned elements are not limited to the above described numeral values.

Figure 4:
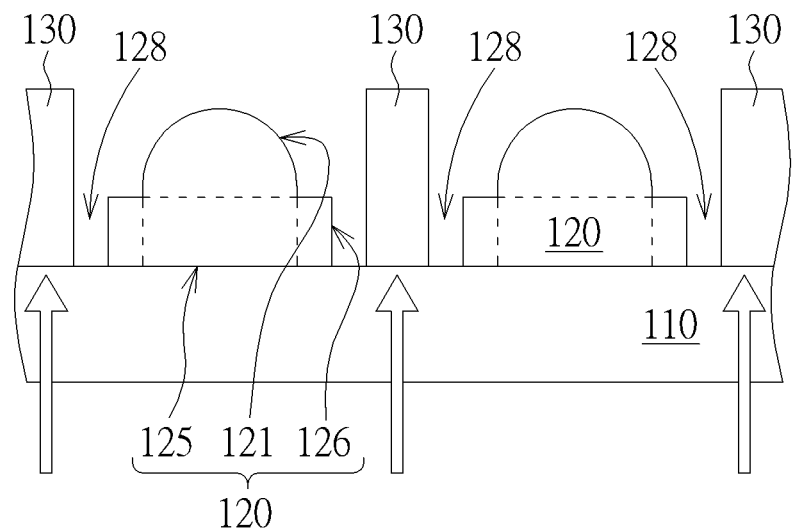

Later, please refer to FIG. 4, a laser treatment is carried out on the interfaces between the spacers 130 and the optically transparent wafer 110. The laser treatment is intentional to make the permanent connection between all the spacers 130 and the optically transparent wafer 110 possible. In other words, after the laser treatment all the spacers 130 are able to be homogeneously bonded to the optically transparent wafer 110 in the absence of a heterogeneous adhesive.

Figure 4A:
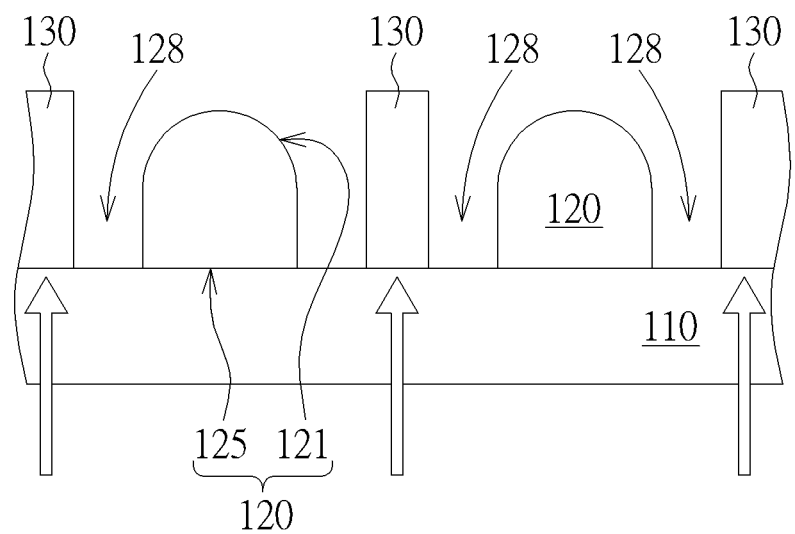
FIG. 4A illustrates that the laser treatment is carried out in the absence of any shoulder.

Preferably, the laser treatment is repeatedly carried out so that all the spacers 130 and the optically transparent wafer 110 have homogeneous bonding. The homogeneous bonding refers to a permanent fixation between two similar materials in the absence of a substantially different material, such as a heterogeneous adhesive, for example, a glue or a dry film. FIG. 4 illustrates that the laser treatment is carried out in the presence of shoulders 126 and FIG. 4A illustrates that the laser treatment is carried out in the absence of any shoulder.

Figure 4B:
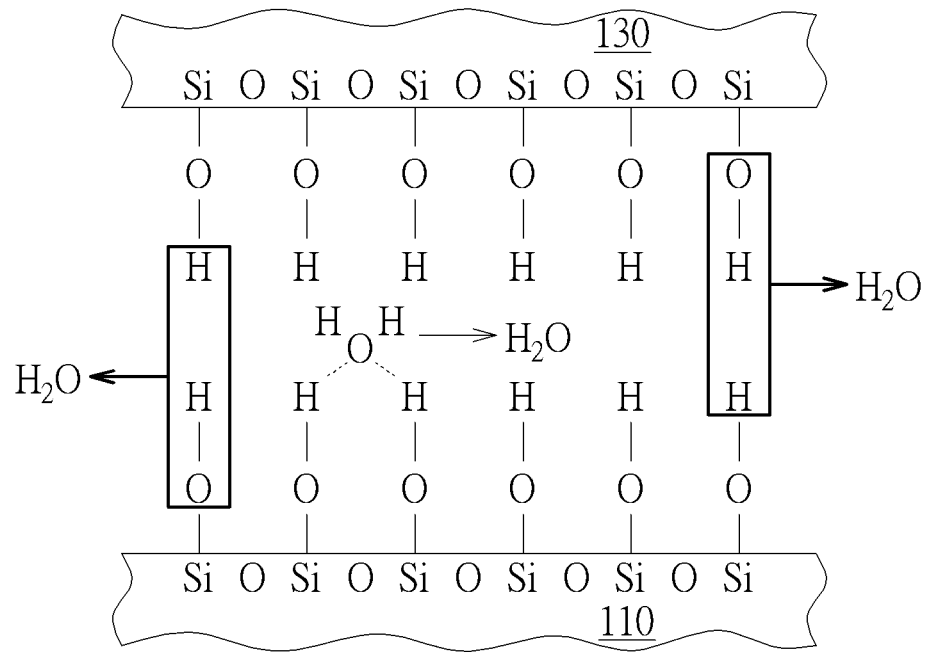
FIG. 4B illustrates that the surface of glass usually has considerable water molecules and hydroxyl groups to form a native hydroxyl group layer.

Generally speaking, glass or a silica material is made of silicon dioxide. Because of the affinity to moist, as shown in FIG. 4B, the surface of glass usually has considerable water molecules and hydroxyl groups which are physically or chemically attached to either the exposed oxygen atoms or the exposed silicon atoms to form a native hydroxyl group layer.

When two pieces of glass or silica material approach each other, the considerable water molecules and hydroxyl groups in the two native hydroxyl group layers repel one another to keep the two pieces from merging with each other because of the repelling force of polarized hydrogen atoms in the water molecules and hydroxyl groups. In view of this phenomenon, the spacer 130 is unable to be permanently attached to the optically transparent wafer 110 even though they are made of the same material, or in other words, even though they have homogeneous constitution.

Figure 4C:
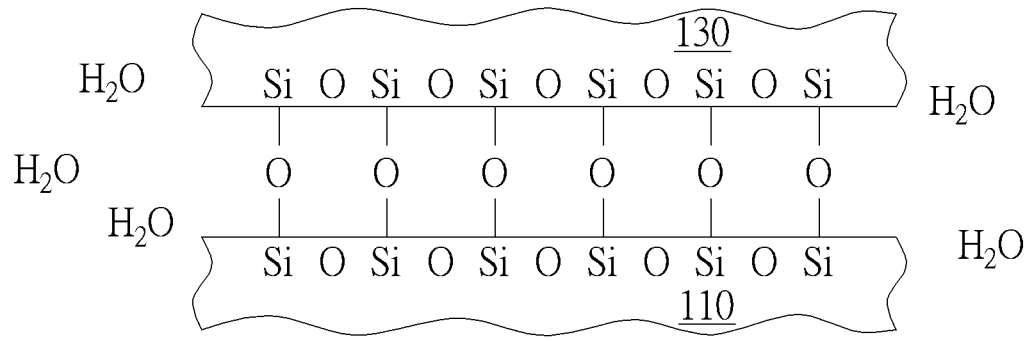
FIG. 4C illustrates that a suitable laser treatment procedure removes most of the water molecules and hydroxyl groups on the surfaces to yield new bridge Si—O—Si bonding.

The inventors of the present invention find out that the spacers 130 may be homogeneously bonded to the optically transparent wafer 110 when the interfaces between the spacers 130 and the optically transparent wafer 110 are modified by a suitable laser treatment procedure. A suitable laser treatment procedure, as shown in FIG. 4C, is able to remove at least most of the water molecules and hydroxyl groups on the surfaces to yield new bridge Si—O—Si bonding.

The new bridge Si—O—Si bonding works as if it were substantially the same as any other chemical bonding between the oxygen atoms and the silicon atoms inside glass or a silica material, for example silicon dioxide. The new bridge Si—O—Si bonding results in a homogeneous bonding between the oxygen atoms and the silicon atoms which are disposed on the interfaces of the spacers 130 and the optically transparent wafer 110.

Since the new generated bridge Si—O—Si bonding substantially has no chemical difference to any other chemical bonding between the oxygen atoms and the silicon atoms inside glass or a silica material, the spacers 130 may be considered to be "homogeneously bonded" to the optically transparent wafer 110 as if the spacers 130 and the optically transparent wafer 110 were integrally formed or one-piece formed like that the spacers 130 and the optically transparent wafer 110 are materially integrated with one another.

The suitable laser treatment procedure to carry out the modification step, for example, may have has a maximum power of 100 W with a wavelength not greater than 1060 nm.

Subsequently, please refer to FIG. 5A, another optically transparent substrate 140 is used to cover the spacers 130, the optical lens sets 120, and the optically transparent wafer 110. The optically transparent substrate 140 may be like another optically transparent wafer 110 with multiple optical lens sets 120, or a cover glass to protect the topmost layer of the optical lens sets 120 on the optically transparent wafer 110. In other words, there may be one or more optically transparent wafers 110 with multiple optical lens sets 120 to form stack layers of optical element layers. Both the spacers 130 and the optically transparent substrate 140 may be made of the same optically transparent material, such as glass or a silica material. Preferably speaking, the optically transparent material for the optically transparent substrate 140 may be glass with the coefficient of thermal expansion as small as possible.

Figure 5:
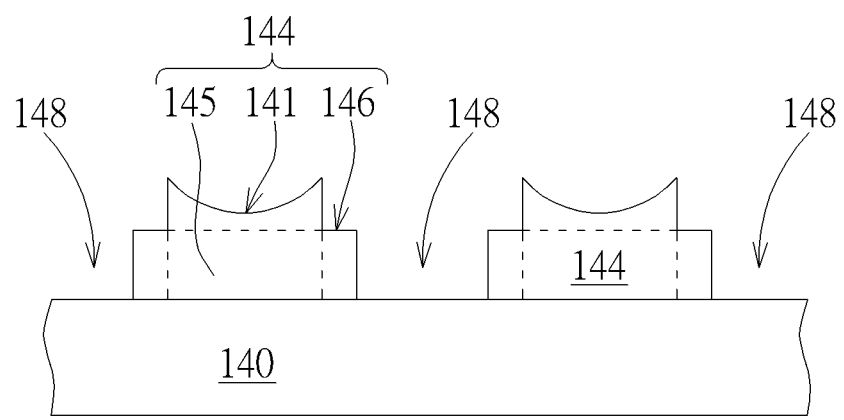

For example, first an optically transparent substrate 140 is provided, as shown in FIG. 5. There are multiple imaging optical lens sets 144, for example, at least two imaging optical lens sets 144 are formed to be disposed on the optically transparent substrate 140. A scribe line 148 is sandwiched between two adjacent individual imaging optical lens sets 144.

Each imaging optical lens set 144 includes one single lens 141 integrated with a residual layer 145, with or without an extending shoulder 146. The surface curvature of each imaging optical lens 141 may be either convex or concave. The imaging optical lens sets 144 respectively correspond to the optical lens sets 120. Please refer to the formation of the optical lens sets 120 for the details of the formation of the imaging optical lens sets 144.

Figure 5A:
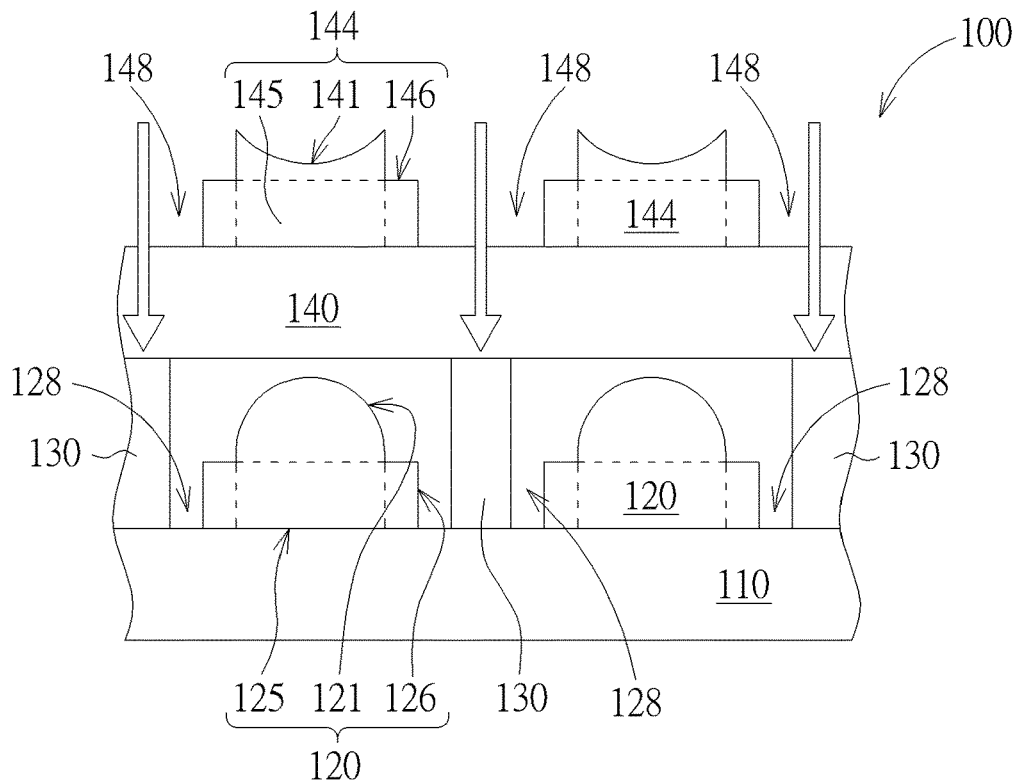
FIG. 5A illustrates that an optically transparent substrate is used to cover the spacers, the optical lens sets, and the optically transparent wafer.

Second, please refer to FIG. 5A, the optically transparent substrate 140 is disposed on the spacers 130 and in direct contact with the spacers 130. The optically transparent substrate 140 in this step is temporarily attached to the spacers 130. In particular, the imaging optical lens sets 144 on the optically transparent substrate 140 are possible to be easily and well align with the optical lens sets 120 on the optically transparent wafer 110 because no thermal treatment has been carried out to induce the unfavorable bow distortion or the unfavorable polymeric layer deformation to jeopardize the alignment between the optical lens sets 120 on the adjacent layers.

Figure 5B:
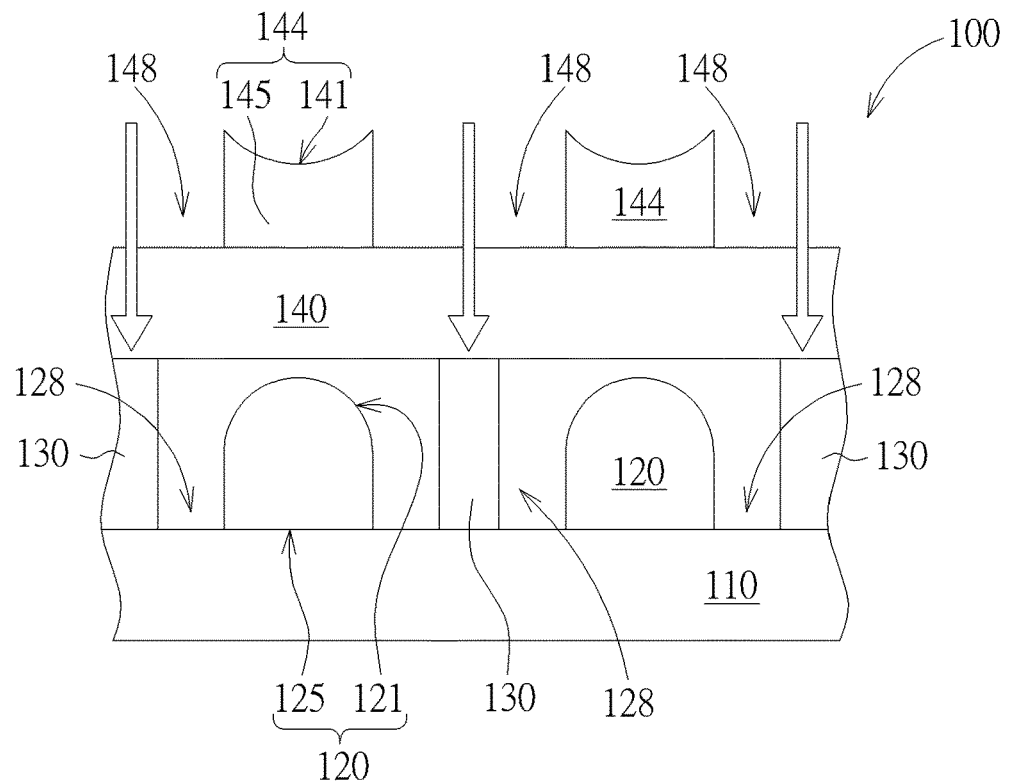
FIG. 5B illustrates that the laser treatment is carried out in the absence of any shoulder.

Because the optically transparent substrate 140 is still temporarily attached to the spacers 130, please refer to FIG. 5A, another suitable laser treatment procedure, such as a substrate laser treatment is carried out on the interfaces between the spacers 130 and the optically transparent substrate 140. The substrate laser treatment, like the previous suitable laser treatment procedure, is used to modify the interfaces between the spacers 130 and the optically transparent substrate 140. FIG. 5B illustrates that that the laser treatment is carried out in the absence of any shoulder.

For example, the substrate laser treatment modifies the interfaces by eliminating at least most of the water molecules and hydroxyl groups on the surfaces to yield new bridge Si—O—Si bonding so that the optically transparent substrate 140 are capable of being homogeneously bonded to the spacers 130 after the substrate laser treatment in the absence of the heterogeneous adhesive. The substrate laser treatment to carry out the modification step, for example, may have has a maximum power of 100 W with a wavelength not greater than 1060 nm.

Figure 6:
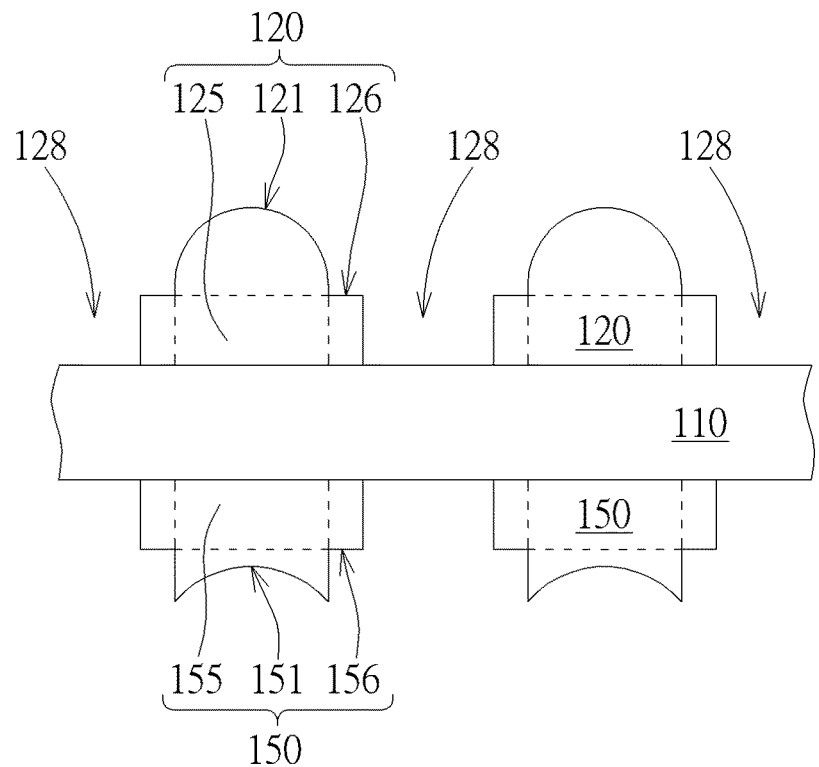
FIG. 6 illustrates that there are multiple bottom optical lens sets with extending shoulders.

Optionally, as shown in FIG. 6, there may be multiple bottom optical lens sets 150, for example, at least two bottom optical lens sets 150 disposed on the optically transparent wafer 110. The bottom optical lens sets 150 are located beneath the optical lens sets 120 and respectively correspond to the optical lens sets 120. In particular, the multiple bottom optical lens sets 150 well align with the optical lens sets 120 atop the multiple bottom optical lens sets 150. Each bottom optical lens set 150 includes one single lens 151 integrated with a residual layer 155, with or without an extending shoulder 156. The surface curvature of each lens 151 in the bottom optical lens sets may be either convex or concave.

Figure 6A:
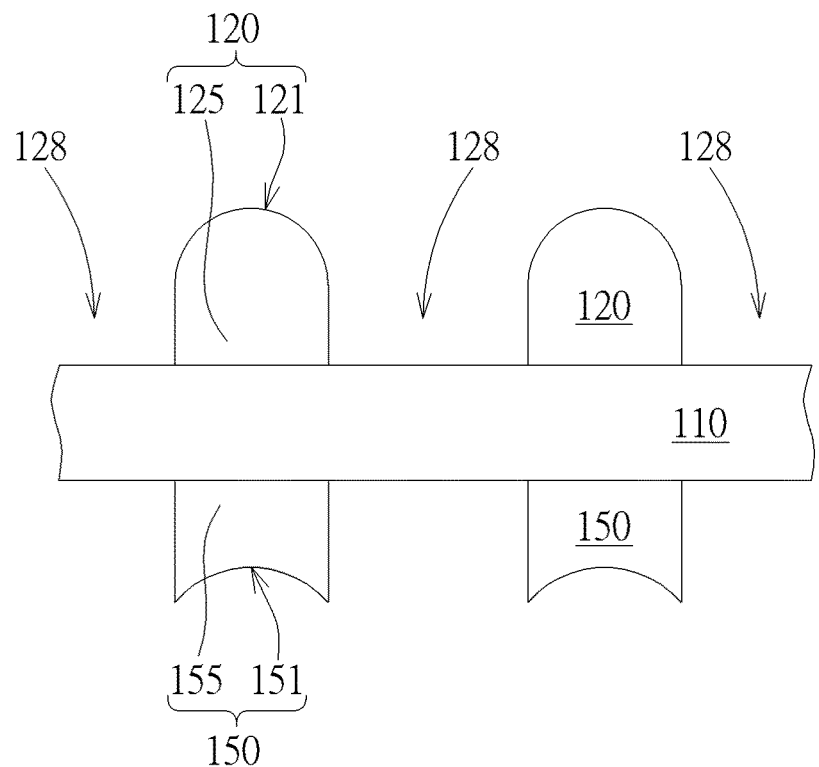
FIG. 6A illustrates that there are multiple bottom optical lens sets without extending shoulder.

The multiple bottom optical lens sets 150 may be formed along with the formation of the optical lens sets 120 or prior to the spacers 130 homogeneously bonded to the optically transparent wafer 110. FIG. 6A illustrates that the optical lens sets has no extending shoulder. Please refer to the formation of the optical lens sets 120 for the details of the formation of the bottom optical lens sets 150. Please also refer to the optical lens sets 120 for the details of the imaging optical lens sets and the bottom optical lens sets 150.

Because both the optically transparent substrate 140 and the optically transparent wafer 110 are possible to undergo no thermal treatment, the optically transparent substrate 140 or the optically transparent wafer 110 shows no unfavorable bow distortion or no unfavorable polymeric layer deformation. Accordingly, the method of the present invention facilitates the wafer-to-wafer alignment accuracy between the imaging optical lens sets 120 on the optically transparent substrate 140 and the optical lens sets 120 on the optically transparent wafer 110.

The present invention in a second aspect provides another novel method to form a wafer-level homogeneous bonding optical structure in the absence of a thermal treatment to overcome the above problems in prior art. FIG. 7 to FIG. 11A illustrate a second example of a novel method to form a wafer-level homogeneous bonding optical structure of the present invention. Please refer to FIG. 7. First, an optically transparent wafer 110 is provided. The optically transparent wafer 110 may be a glass wafer made of optically transparent material, such as glass or a silica material.

There are multiple optical lens sets 120 disposed on the optically transparent wafer 110. For example, there are at least two optical lens 120 sets disposed on and in direct contact with the optically transparent wafer 110. Preferably speaking, there are multiple optical lens sets 120 to form an array disposed on the optically transparent wafer 110.

Each optical lens set 120 includes one single lens 121 integrated with a residual layer 125, with or without an extending shoulder 126. The lenses 121 and the residual layer 125 are made of the same optically transparent material, such as a polymeric material, to serve as the optical lens sets 120. The surface curvature of each optical lens 121 may be either convex or concave.

Preferably speaking, the polymeric material may be an acrylate-type material or a methacrylate-type material. The lenses 121 and the residual layer 125 are integrally formed or one-piece formed so the lenses 121 and the residual layer 125 are integrated with one another and not separable. For example, the lenses 121 and the residual layer 125 may be formed by the polymerization of monomers or oligomers of an acrylate-type material or a methacrylate-type material in the presence of a template (not shown) to facilitate the formation of the surface curvature of each lens 121.

Each of the optical lens sets 120 further includes an extending shoulder 126 to surround the residual layer 125. One extending shoulder 126 is not in contact with another extending shoulder 126 of an adjacent optical lens set 120 because of a scribe line 128. In other words, a scribe line 128 is sandwiched between two adjacent individual optical lens sets 120.

Figure 7:
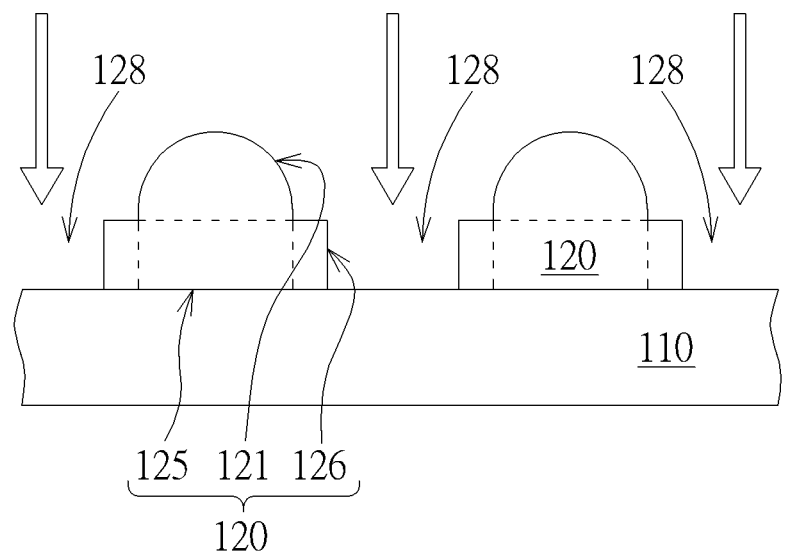
FIG. 7, FIG. 8 and FIG. 9 illustrate a second example of a novel method to form a wafer-level homogeneous bonding optical structure of the present invention.
Figure 7A:
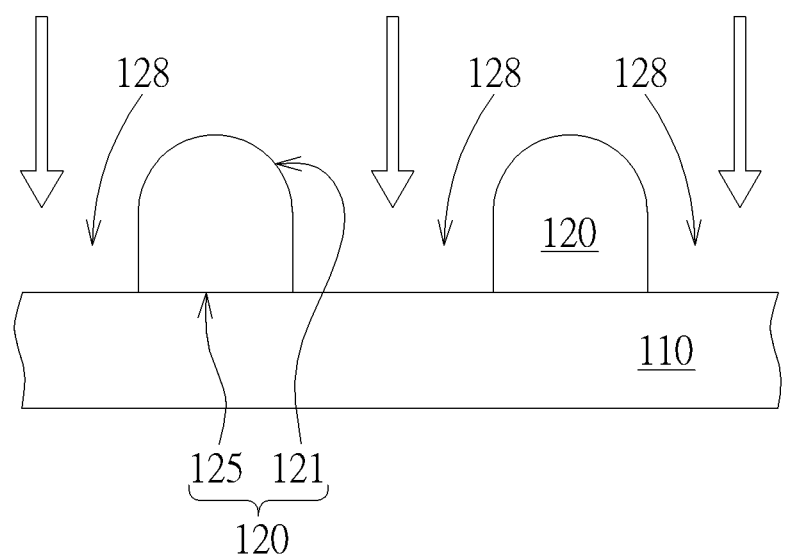
FIG. 7A illustrates that there is no shoulder in each optical lens set.

For example, the residual layer 125 in each optical lens set 120 is wider than the lens 121 atop it, and the wider region of the residual layer 125 in each optical lens set 120 serves as the extending shoulder 126 of the optical lens set 120. A wider shoulder 126 makes the scribe line 128 narrower. Or alternatively, as shown in FIG. 7A, there is no shoulder in each optical lens set 120. With or without an extending shoulder 126, each optical lens set 120 is isolated and not in contact with one another. Please refer to the above descriptions for the details of the optical lens sets 120 and the optically transparent wafer 110.

Figure 8:
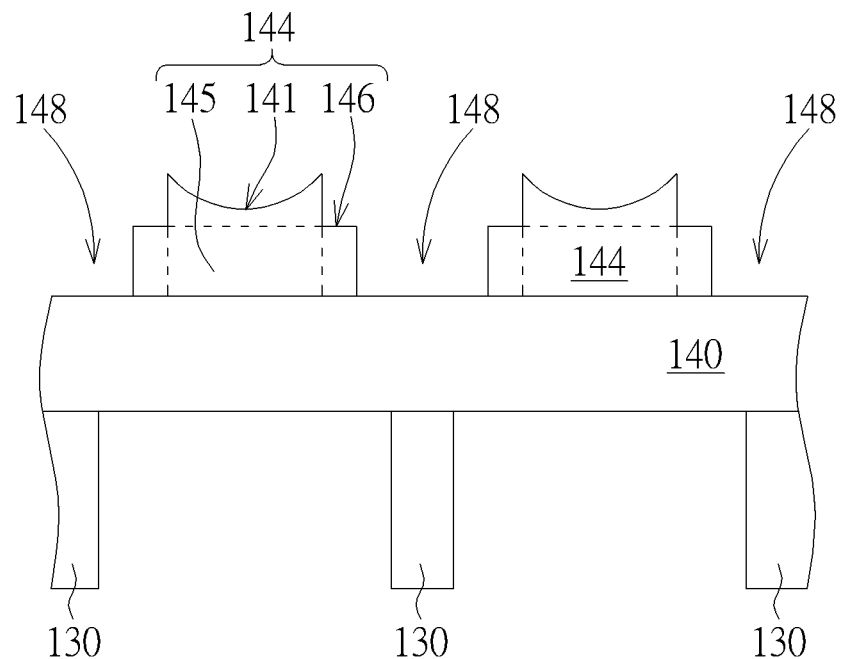

Second, please refer to FIG. 8, an optically transparent substrate 140 is provided. There are multiple spacers 130, for example, there are a spacer 130 and at least two imaging optical lens sets 144 disposed on the optically transparent substrate 140. The optically transparent substrate 140 may be like another optically transparent wafer 110 with multiple optical lens sets 120, or a cover glass to protect the topmost layer of the optical lens sets 120 on the optically transparent wafer 110. In other words, there may be one or more optically transparent wafers 110 with multiple optical lens sets 120 to form stack layers of optical element layers. Preferably speaking, both the spacers 130 and the optically transparent substrate 140 are made of the same optically transparent material, such as glass or a silica material.

Figure 8A:
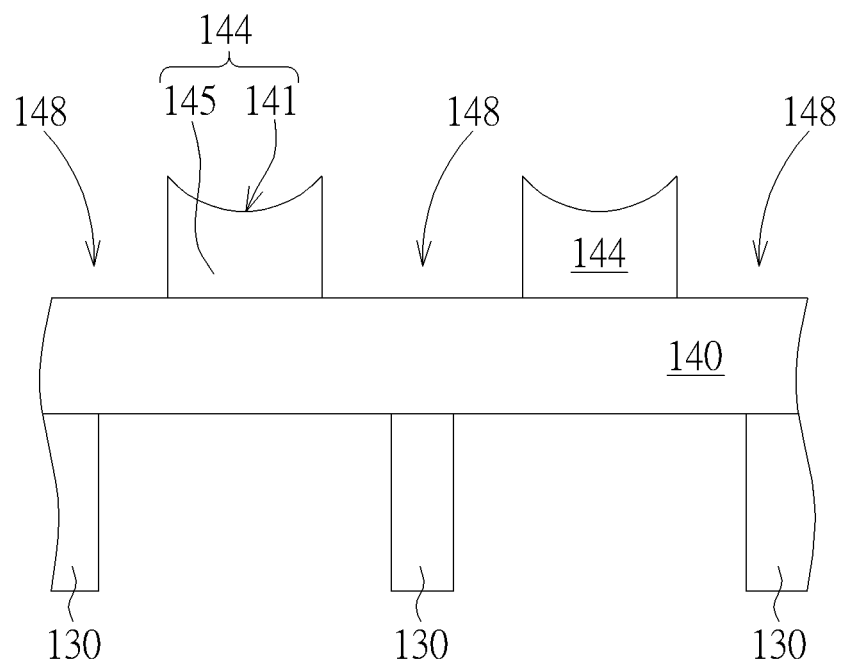
FIG. 8A illustrates that the residual layer has no extending shoulder.

Each imaging optical lens set 144 includes one single lens 141 integrated with a residual layer 145, and the residual layer 145 may be with or without an extending shoulder 146. The surface curvature of each imaging optical lens 141 may be either convex or concave. The imaging optical lens sets 144 respectively correspond to the optical lens sets 120. Please refer to the formation of the optical lens sets 120 for the details of the formation of the imaging optical lens sets 144. FIG. 8A illustrates that the residual layer 145 has no extending shoulder.

Figure 9:
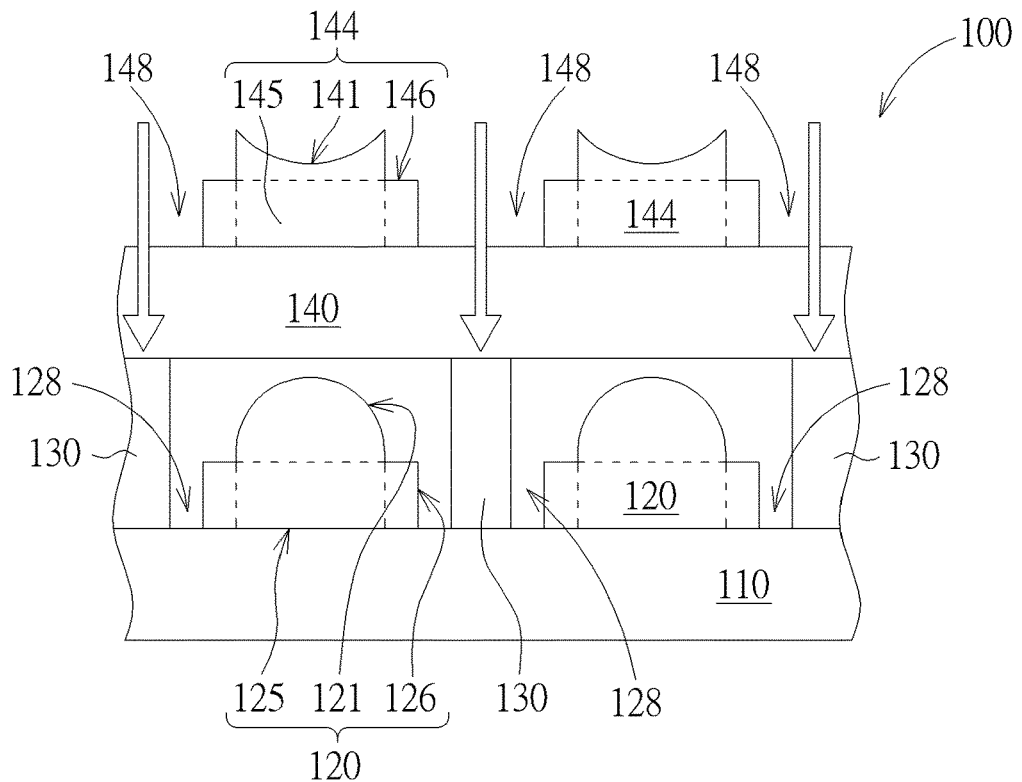

Next, please refer to FIG. 9, the optically transparent substrate 140 is combined with the optically transparent wafer 110 so that the optically transparent wafer 110 is in direct with the spacers 130 and there is no glue, no dry film or any other adhesive disposed between the spacer 130 and the optically transparent wafer 110. Further, each spacer 130 is partially placed in the scribe line 128. In other words, one spacer 130 is disposed between two adjacent optical lens sets 120 to segregate two adjacent optical lens sets 120.

Figure 9A:
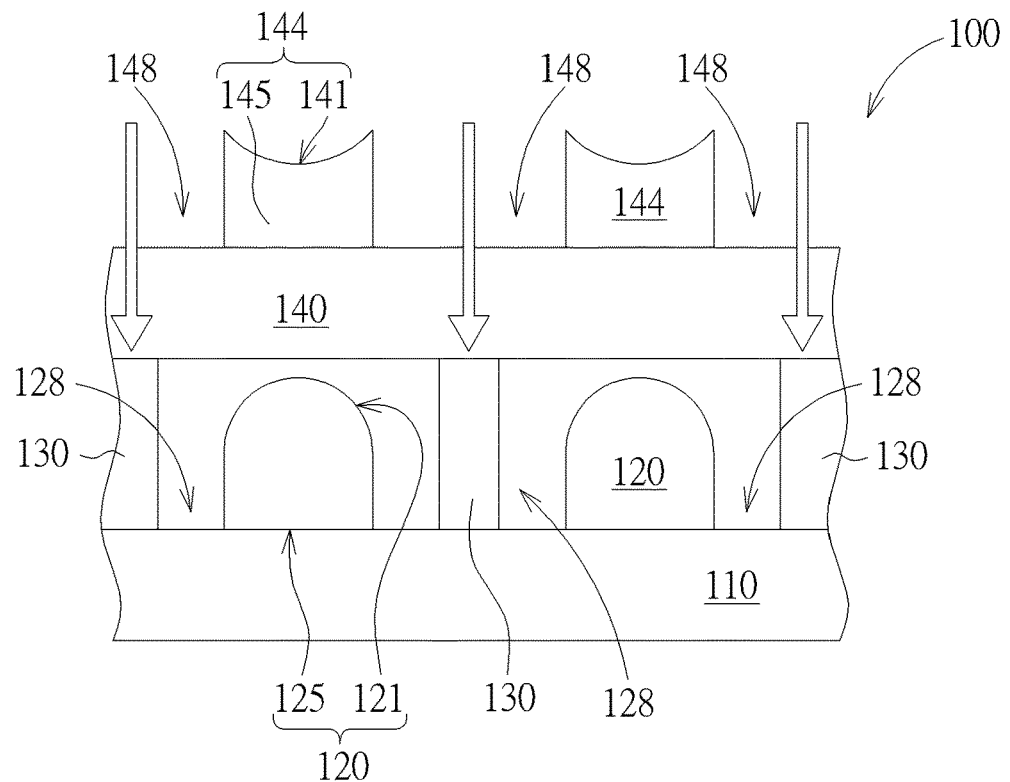
FIG. 9A illustrates that the laser treatment is carried out in the absence of any shoulder.

Then, a laser treatment is carried out on the interfaces between the spacers 130 and the optically transparent wafer 110. The laser treatment is intentional to make the permanent connection between all the spacers 130 and the optically transparent wafer 110 possible. In other words, after the laser treatment all the spacers 130 are able to be homogeneously bonded to the optically transparent wafer 110 in the absence of a heterogeneous adhesive. FIG. 9 illustrates that the laser treatment is carried out in the presence of shoulders and FIG. 9A illustrates that the laser treatment is carried out in the absence of any shoulder.

For example, the laser treatment modifies the interfaces by eliminating at least most of the water molecules and hydroxyl groups on the surfaces to yield new bridge Si—O—Si bonding so that the optically transparent wafer 110 are capable of being homogeneously bonded to the spacers 130 after the laser treatment in the absence of the heterogeneous adhesive. The laser treatment to carry out the modification step, for example, may have a maximum power of 100 W with a wavelength not greater than 1060 nm. Preferably, with or without a shoulder 126, the spacer 130 is not in direct contact with any one of the optical lens sets 120.

After the laser treatment, the spacers 130 may be considered to be "homogeneously bonded" to the optically transparent wafer 110 as if the spacers 110 and the optically transparent wafer 110 were integrally formed or one-piece formed like that the spacers 130 and the optically transparent wafer 110 are materially integrated with one another.

After the above methods to form a wafer-level homogeneous bonding optical structure, a wafer-level homogeneous bonding optical structure 100 is resultantly obtained. Accordingly, the present invention in a third aspect provides a novel wafer-level homogeneous bonding optical structure 100 to be free of bow distortion or free of interlayer misalignment in order to overcome the problems in prior art.

FIG. 5A, FIG. 5B, FIG. 9 and FIG. 9A respectively illustrate an example of a novel wafer-level homogeneous bonding optical structure 100 of the present invention. The wafer-level homogeneous bonding optical structure 100 of the present invention at least includes an optically transparent wafer 110, multiple optical lens sets 120, and multiple spacers 130. In one embodiment of the wafer-level homogeneous bonding optical structure, the optically transparent wafer 130 is flat glass.

There may be an optically transparent substrate 140 which covers the spacers 130, the optical lens sets 120, and the optically transparent wafer 110. There are multiple optical lens sets 120 disposed on the optically transparent wafer 110, for example, there are at least two optical lens sets 120 disposed on the optically transparent wafer 110. In particular, each one of the optical lens sets 120 includes a lens 121 atop and integrated with a residual layer 125 to form an "omega Ω" shape altogether. One optical lens sets 120 without an extending shoulder 126 forms a bullet shape. The surface curvature of each lens 121 may be either convex or concave and each residual layer 125 may have an extending shoulder 126 or no extending shoulder.

Similarly, there may be multiple imaging optical lens sets 144 which are disposed on the optically transparent substrate 140 and respectively correspond to the optical lens sets 120. In particular, each of the imaging optical lens sets 144 includes a lens 141 atop and integrated with a residual layer 145 as well. The surface curvature of a lens 141 in an imaging optical lens set 144 may be either convex or concave and each residual layer 145 in an imaging optical lens set 141 may have an extending shoulder 146 or no extending shoulder at all.

FIG. 5A and FIG. 9 illustrate that the wafer-level homogeneous bonding optical structure 100 of the present invention has an extending shoulder 126 or an extending shoulder 146. FIG. 5B and FIG. 9A illustrate that the wafer-level homogeneous bonding optical structure 100 of the present invention has no extending shoulder at all.

The optically transparent wafer 110, the spacers 130 and the optically transparent substrate 140 may be made of an optically transparent material, such as glass or a silica material. For example, the optically transparent material may be glass with the coefficient of thermal expansion as small as possible. Preferably speaking, the optically transparent wafer 110, the spacers 130 and the optically transparent substrate 140 may be made of the same optically transparent material.

In one embodiment of the present invention, the optional optically transparent substrate 140 may be like another optically transparent wafer 110 with multiple optical lens sets 120, or a cover glass to protect the optical lens sets 120 on the topmost layer of the optically transparent wafer 110. In other words, there may be one or more optically transparent wafers 110 with multiple optical lens sets 120 to form stack layers of optical element layers.

Further, there are multiple scribe lines 128 disposed between the optical lens sets 120. Each scribe line 128 may be considered to be defined by two adjacent individual optical lens sets 120. For example, each scribe line 128 is sandwiched between two adjacent individual optical lens set 120 to segregate the two adjacent optical lens sets 120. Moreover, the scribe line 128 is deep enough to expose the underlying optically transparent wafer 110. In particular, a wider shoulder 126 of an optical lens set 120 makes the scribe line 128 narrower.

There are multiple spacers 130 disposed on the optically transparent wafer 110, and each spacer 130 is disposed between the optically transparent wafer 110 and the optically transparent substrate 140. In particular, each spacer 130 is disposed between two adjacent optical lens sets 120 and partially inside a corresponding scribe line 128 to segregate the two isolated and adjacent optical lens sets 120 but any extending shoulder 126 is not indirect contact with an adjacent spacer 130.

In one embodiment of the present invention, the spacers 130 are homogeneously bonded to the optically transparent wafer 110 in the absence of a heterogeneous adhesive because the optically transparent wafer 110 and the spacers 130 may be made of the same optically transparent material, such as glass. Similarly, the spacers 130 are homogeneously bonded to the optically transparent substrate 140 in the absence of a heterogeneous adhesive because the spacers 130 and the optically transparent substrate 140 may be made of the same optically transparent material, such as glass or a silica material.

For example, both the optically transparent wafer 110 and the spacers 130 are made of glass so that the spacers 130 are capable of being integrated with the optically transparent wafer 110 in the absence of the heterogeneous adhesive. "Homogeneously bonding" refers to a permanent fixation between two similar materials in the absence of a substantially different material, such as a heterogeneous adhesive, for example, a glue or a dry film.

The size of the spacer 130 is dependent upon the sizes of the optical lens set 120 and of the scribe line 128. For example, as shown in FIG. 3B, the diameter of a lens 121 may be approximately 100 μm. The residual layer 125 with shoulders 126 of an optical lens set 120 may be in a shape of a rectangular with the dimensions of approximately 1.4 mm*2.2 mm. The pitch of two adjacent optical lens sets 120 (from the center of one lens 121 to the center of another adjacent lens 121) is approximately 2.3 mm and the width of the scribe line 128 may be approximately 140 μm. Preferably, the width of a spacer 130 is smaller than that of a scribe line 128. For example, the width of a spacer 130 may be 130 μm. However, the sizes of the above mentioned elements are not limited to the above described numeral values.

Optionally, as shown in FIG. 6 or FIG. 6A, there may be multiple bottom optical lens sets 150, for example, at least two bottom optical lens sets 150 disposed on the optically transparent wafer 110. The bottom optical lens sets 150 are located beneath the optical lens sets 120 and respectively correspond to the optical lens sets 120. In particular, the multiple bottom optical lens sets 150 well align with the optical lens sets 120 atop the multiple bottom optical lens sets 150. Each bottom optical lens set 150 includes one single lens 151 integrated with a residual layer 151, with or without an extending shoulder 156. The surface curvature of each lens 151 in the bottom optical lens sets 150 may be either convex or concave.

The novel method to form a wafer-level homogeneous bonding optical structure of the present invention does not use a thermal treatment to fix the spacers on the optically transparent wafer to avoid the bow distortion of the optically transparent wafer. Further, there is no thermal treatment either to cause undesirable misalignment of stack layers to overcome the problems in prior art. Accordingly, the obtained novel wafer-level homogeneous bonding optical structure has neither undesirable bow distortion nor undesirable interlayer misalignment to show better product quality and optical performance.

Because the optically transparent substrate or the optically transparent wafer of the present invention shows no unfavorable bow distortion or no unfavorable polymeric layer deformation, the wafer-level homogeneous bonding optical structure of the present invention exhibits excellent overall interlayer alignment to show better product quality, outstanding appearance and optical performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer-level homogeneous bonding optical structure, comprising:
    an optically transparent wafer;
    at least two optical lens sets disposed on said optically transparent wafer, wherein each of said optical lens sets comprising a lens integrated with a residual layer; and
    at least one spacer disposed on said optically transparent wafer, wherein said spacer is disposed between two adjacent said optical lens sets, wherein said spacer and said optically transparent wafer are made of a silica material, and said spacers are homogeneously bonded to said optically transparent wafer in the absence of a heterogeneous adhesive with a bridge Si—O—Si bonding to result in a homogeneous bonding disposed on an interface of said spacer and said optically transparent wafer.

2. The wafer-level homogeneous bonding optical structure of claim 1, wherein said optically transparent wafer is flat glass.

3. The wafer-level homogeneous bonding optical structure of claim 1, wherein said spacers are made of glass so that said spacers are capable of being integrated with said optically transparent wafer in the absence of said heterogeneous adhesive.

4. The wafer-level homogeneous bonding optical structure of claim 1, wherein each of said optical lens sets comprises an extending shoulder and said extending shoulder is not in contact with one of adjacent said spacers.

5. The wafer-level homogeneous bonding optical structure of claim 1, wherein each of said optical lens sets is isolated so that one of said spacers segregates two of adjacent said optical lens sets.

6. The wafer-level homogeneous bonding optical structure of claim 1, further comprising:
    an optically transparent substrate disposed on said spacers and in direct contact with said spacers.

7. The wafer-level homogeneous bonding optical structure of claim 6, wherein both said spacers and said optically transparent substrate are made of glass so that said spacers are capable of being homogeneously bonded to said optically transparent substrate in the absence of said heterogeneous adhesive.

8. The wafer-level homogeneous bonding optical structure of claim 6, further comprising:
    at least two imaging optical lens sets disposed on said optically transparent substrate and respectively corresponding to said at least two optical lens sets.

9. The wafer-level homogeneous bonding optical structure of claim 1, further comprising:
    at least two bottom optical lens sets disposed on said optically transparent wafer, located beneath said at least two optical lens sets and respectively corresponding to said at least two optical lens sets.

10. A method to form a wafer-level homogeneous bonding optical structure, comprising:
    providing an optically transparent wafer with at least two optical lens sets disposed on said optically transparent wafer, wherein each of said optical lens sets is isolated and comprises a lens integrated with a residual layer;
    providing at least one spacer in direct contact with said optically transparent wafer so that said spacer is disposed between two adjacent said optical lens sets to segregate two of adjacent said optical lens sets; and
    performing a laser treatment so that said spacer is homogeneously bonded to said optically transparent wafer in the absence of a heterogeneous adhesive.

11. The method to form a wafer-level homogeneous bonding optical structure of claim 10, wherein both said optically transparent wafer and said spacers are made of glass so that said spacers are capable of being integrated with said optically transparent wafer after said laser treatment in the absence of said heterogeneous adhesive.

12. The method to form a wafer-level homogeneous bonding optical structure of claim 10, wherein said laser treatment has a maximum power of 100 W with a wavelength not greater than 1060 nm.

13. The method to form a wafer-level homogeneous bonding optical structure of claim 10, wherein each of said optical lens sets comprises an extending shoulder and said extending shoulder is not in contact with one of adjacent said spacers.

14. The method to form a wafer-level homogeneous bonding optical structure of claim 10, further comprising:
    providing an optically transparent substrate disposed on said spacers and in direct contact with said spacers; and
    performing a substrate laser treatment so that said spacer is homogeneously bonded to said optically transparent substrate in the absence of a heterogeneous adhesive.

15. The method to form a wafer-level homogeneous bonding optical structure of claim 14, wherein both said spacers and said optically transparent substrate are made of glass so that said spacers are capable of being homogeneously bonded to said optically transparent substrate after said substrate laser treatment in the absence of said heterogeneous adhesive.

16. The method to form a wafer-level homogeneous bonding optical structure of claim 14, wherein said substrate laser treatment has a maximum power of 100 W with a wavelength not greater than 1060 nm.

17. The method to form a wafer-level homogeneous bonding optical structure of claim 14, wherein there are at least two imaging optical lens sets disposed on said optically transparent substrate and respectively correspond to said at least two optical lens sets.

18. The method to form a wafer-level homogeneous bonding optical structure of claim 10, wherein there are at least two bottom optical lens sets disposed on said optically transparent wafer, located beneath said at least two optical lens sets and respectively corresponding to said at least two optical lens sets.

19. A method to form a wafer-level homogeneous bonding optical structure, comprising:

providing an optically transparent wafer with at least two optical lens sets disposed on said optically transparent wafer, wherein each of said optical lens sets is isolated and comprises a lens integrated with a residual layer;

providing an optically transparent substrate with at least one spacer;

combining said optically transparent substrate with said optically transparent wafer so that said optically transparent wafer is in direct with said spacers and said spacer is disposed between two adjacent said optical lens sets to segregate two of adjacent said optical lens sets; and performing a laser treatment so that said spacer is homogeneously bonded to said optically transparent wafer in the absence of a heterogeneous adhesive.

20. The method to form a wafer-level homogeneous bonding optical structure of claim 19, wherein both said optically transparent wafer and said spacers are made of glass so that said spacers are capable of being attached to said optically transparent wafer after said laser treatment in the absence of said heterogeneous adhesive.

* * * * *